US010944486B2

(12) United States Patent
Ahmed et al.

(10) Patent No.: US 10,944,486 B2
(45) Date of Patent: Mar. 9, 2021

(54) DC CURRENT CANCELLATION SCHEME FOR AN OPTICAL RECEIVER

(71) Applicant: Elenion Technologies, LLC, New York, NY (US)

(72) Inventors: Mostafa Ahmed, Urbana, IL (US); Alexander Rylyakov, Staten Island, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/833,314

(22) Filed: Dec. 6, 2017

(65) Prior Publication Data

US 2019/0173588 A1 Jun. 6, 2019

(51) Int. Cl.
*H04B 10/60* (2013.01)
*H04B 10/69* (2013.01)
*H04B 10/67* (2013.01)
*H03F 1/00* (2006.01)
*H03F 3/00* (2006.01)

(52) U.S. Cl.
CPC ....... *H04B 10/6911* (2013.01); *H04B 10/671* (2013.01); *H04B 10/693* (2013.01); *H03F 1/00* (2013.01); *H03F 3/00* (2013.01); *H04B 10/60* (2013.01); *H04B 10/69* (2013.01)

(58) Field of Classification Search
CPC .............. H04B 10/6911; H04B 10/671; H04B 10/693; H04B 10/69; H04B 10/60; H03F 1/00; H03F 3/00
USPC .................................................. 398/202–214
See application file for complete search history.

(56) References Cited

U.S. PATENT DOCUMENTS

| 4,540,952 A | * | 9/1985 | Williams | ................ H03F 1/083 330/279 |
| 5,012,202 A | * | 4/1991 | Taylor | ................ H03F 3/45076 250/214 A |
| 5,030,925 A | * | 7/1991 | Taylor | ..................... H03F 3/082 250/214 A |

(Continued)

OTHER PUBLICATIONS

Awny et al, A dual 64 Gbaud 10k Ohm 5 precent THD linear differential transimpedance amplifier, Feb. 2016, IEEE, ISSCC, All Document. (Year: 2016).*

*Primary Examiner* — Dibson J Sanchez
(74) *Attorney, Agent, or Firm* — Stratford Managers Corporation (57) ABSTRACT

In high data rate receivers, comprising a photodetector (PD) and a transimpedance amplifier (TIA), a transmitted optical signal typically has poor extinction ratio, which translates into a small modulated current with a large DC current at the output of the PD. The large DC current saturates the TIA, which significantly degrades the gain and bandwidth performance. Accordingly, cancelling photo diode DC current in high data rate receivers is important for proper receiver operation. A DC current cancellation loop, comprising a low pass filter section and a trans-conductance cell (GM) are connected to the input of the TIA. PD DC current $I_{DC}$ is drawn from the input node of the TIA in the GM cell, such that the cancellation loop maintains the DC voltage value of the TIA input node to be the same as a reference voltage ($V_{REF}$).

9 Claims, 6 Drawing Sheets

(56) References Cited

U.S. PATENT DOCUMENTS

| | | | | |
|---|---|---|---|---|
| 5,327,027 A * | 7/1994 | Taylor | H03H 11/405 | 327/336 |
| 5,329,115 A * | 7/1994 | Lim | H03F 3/087 | 250/214 A |
| 5,343,160 A * | 8/1994 | Taylor | H03F 3/087 | 330/295 |
| 5,430,765 A * | 7/1995 | Nagahori | H04B 10/6933 | 330/259 |
| 6,809,596 B2 * | 10/2004 | Seetharaman | H03F 3/087 | 250/214 R |
| 7,368,999 B2 * | 5/2008 | Natzke | H03F 3/08 | 330/308 |
| 7,372,329 B1 * | 5/2008 | Tan | H03F 1/08 | 330/253 |
| 7,671,680 B2 * | 3/2010 | Hara | H03G 3/3084 | 330/129 |
| 8,530,819 B2 * | 9/2013 | Ritter | G01J 1/46 | 250/214 A |
| 9,571,045 B2 * | 2/2017 | Frank | H03F 1/42 | |
| 9,819,421 B1 * | 11/2017 | Xie | H04B 10/693 | |
| 10,333,516 B2 * | 6/2019 | Li | H03K 17/941 | |
| 2002/0089728 A1 * | 7/2002 | Kim | H04B 10/6933 | 398/202 |
| 2003/0219260 A1 * | 11/2003 | Chiou | H03F 3/087 | 398/202 |
| 2004/0119540 A1 * | 6/2004 | Seetharaman | H03F 3/087 | 330/308 |
| 2004/0119541 A1 * | 6/2004 | Seetharaman | H03F 3/45183 | 330/308 |
| 2005/0116778 A1 * | 6/2005 | Braier | H03F 3/087 | 330/308 |
| 2005/0128006 A1 * | 6/2005 | Davies | H03F 1/34 | 330/308 |
| 2010/0045387 A1 * | 2/2010 | Ohta | H03F 3/082 | 330/308 |
| 2010/0254711 A1 * | 10/2010 | Miller | H03F 3/087 | 398/136 |
| 2011/0215870 A1 * | 9/2011 | Lao | H03F 3/45475 | 330/260 |
| 2012/0033980 A1 * | 2/2012 | Dong | H04B 10/693 | 398/202 |
| 2013/0188963 A1 * | 7/2013 | Afriat | H04B 10/60 | 398/135 |
| 2014/0049323 A1 * | 2/2014 | Proesel | H03F 3/08 | 330/291 |
| 2014/0111280 A1 * | 4/2014 | Schuppener | H03F 3/45475 | 330/291 |
| 2014/0306760 A1 * | 10/2014 | Piepenstock | H03F 3/45085 | 330/261 |
| 2015/0022268 A1 * | 1/2015 | Kao | H03F 3/45071 | 330/259 |
| 2015/0256266 A1 * | 9/2015 | Duthel | H04B 10/616 | 398/38 |
| 2015/0295660 A1 * | 10/2015 | Suzuki | H03F 3/08 | 398/208 |
| 2015/0372648 A1 * | 12/2015 | Sugimoto | H04B 10/272 | 330/2 |
| 2016/0164624 A1 * | 6/2016 | Yamauchi | H04B 10/0799 | 398/34 |
| 2018/0006732 A1 * | 1/2018 | Pang | H04B 10/691 | |
| 2018/0091231 A1 * | 3/2018 | Rodriguez-Perez | H03G 3/001 | |
| 2018/0234761 A1 * | 8/2018 | Fishman | H04R 3/005 | |
| 2019/0020320 A1 * | 1/2019 | Nallani | H03F 1/3211 | |

\* cited by examiner

DC CURRENT CANCELLATION SCHEME FOR AN OPTICAL RECEIVER

TECHNICAL FIELD

The present invention relates to an optical receiver, and in particular to an optical receiver with DC current cancellation.

BACKGROUND

Figure 1:
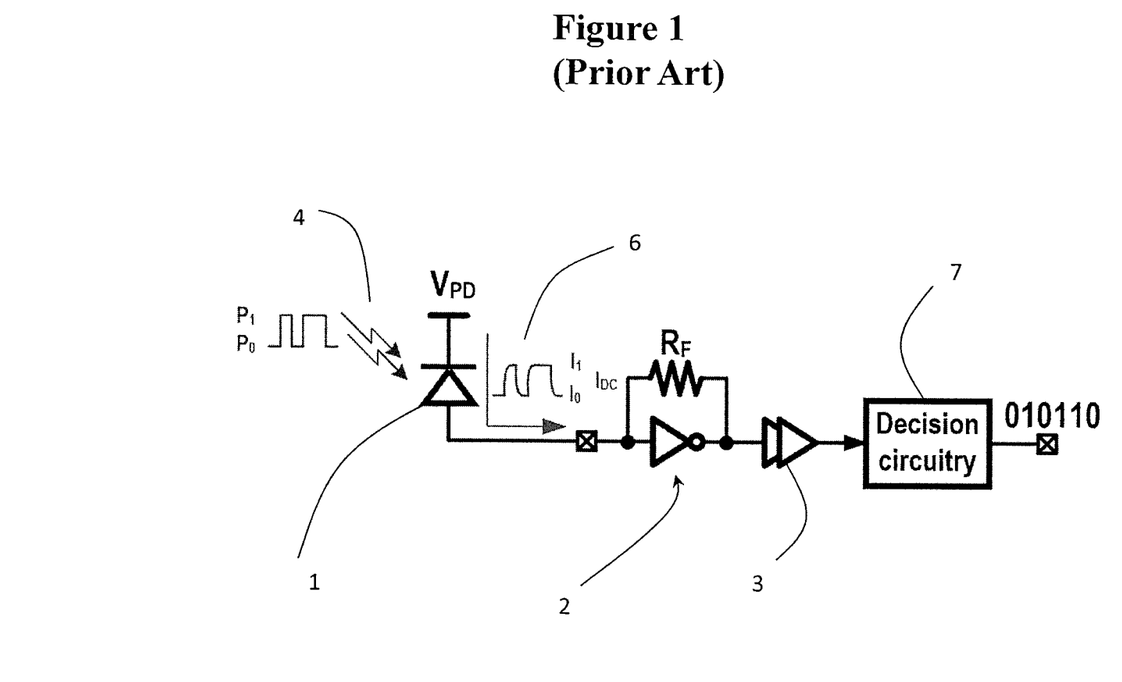
FIG. 1 illustrates a schematic diagram of a conventional NRZ optical receiver.

A typical optical receiver front-end is composed of a photo diode (PD) 1 followed by a trans-impedance amplifier (TIA) 2 and main amplifiers (MAs) 3 as shown in FIG. 1. The PD 1 receives a transmitted optical signal 4 and generates a current 6 proportional to the received optical power of the received optical signal 4. The ratio between PD output current 6 to the input optical power of the optical signal 4 is the photo diode responsivity (R). The TIA 2 converts the PD current 6 to voltage, which is then amplified by MAs 3 to the desired signal level for the decision circuitry 7. For NRZ modulation, the modulation depth of the optical signal 4 is defined by its extinction ratio, which is the ratio between optical power for symbol one ($P_1$) and optical power for symbol zero ($P_0$). In high data rate receivers, the transmitted optical signal 4 has poor extinction ratio and translates into a small modulated current with a large DC current at the output of the photo diode 1. The large DC current saturates the receiver front-end (TIA 2 and MAs 3) and significantly degrades the gain and bandwidth performance. Consequently, cancelling photo diode DC current in high data rate receivers is desired for proper receiver operation, i.e. to have zero average modulated PD current 6.

Moreover, for coherent optical communication links, mixing local laser power and the received modulated optical signal 4 using the photo diode 1 results in very large DC current. PD DC current is expressed as, $$I_{DC} = R \times (P_{LO} + P_S), \quad (1)$$

where $P_{LO}$ is the local optical laser power and $P_S$ is the received optical signal power. Equation (1) shows that the photo diode output DC current of the PD 1 in coherent optical communication links depends on the local laser power and the optical received power. For example, a photo diode 1 with responsivity (R) of 1 A/W results in 4 mA DC current at 6 dBm local laser power input. Such a large DC current is more than enough to saturate the receiver front-end and severely degrades its performance. Thus, it is very important to have DC current cancellation circuitry in front of the TIA 2 of coherent optical communication links.

Figure 2:
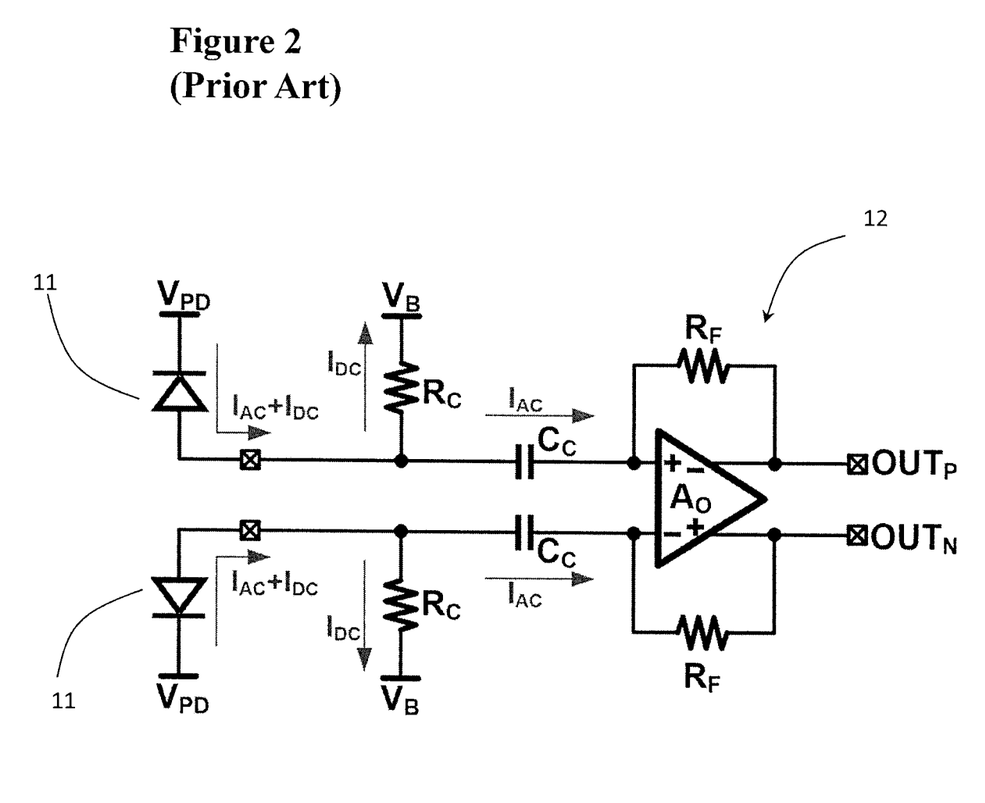
FIG. 2 illustrates a schematic diagram of a conventional differential optical receiver.

FIG. 2 shows a conventional way to AC couple receiver photo diodes 11 to the a front-end TIA 12 using passive AC coupling circuitry. An AC coupling capacitor ($C_C$) is inserted between the photo diode 11 and the front-end TIA 12 to block the DC current; however, it bypasses the modulated AC current to the TIA 12. A biasing resistor ($R_C$) is used to bias the photo diode anode voltage to be reverse biased, and provides an alternative path for the photo diode DC current $I_{DC}$. The biasing resistor $R_C$ with the AC coupling capacitor $C_C$ forms a high pass filter section in the RF signal path and its cutoff frequency (FC) is calculated as, $$F_C = \frac{1}{2\pi R_C C_C} \quad (2)$$

Typically, the required TIA low cutoff frequency (FC) is around 100 kHz which requires either large AC coupling capacitor $C_C$ or huge biasing resistor $R_C$. As an example, a capacitor $C_C$ with a capacitance of at least 1.6 pF with a resistor $R_C$ with a resistance of at least 1 MΩ are required to achieve cutoff frequency of 100 kHz. Yet, this technique suffers from two main drawbacks: 1) $C_C$ parasitic capacitance, and 2) photo diode biasing. For bulk silicon technologies, the bottom plate ground parasitic capacitance of the coupling capacitor $C_C$ is around 10% of its value and degrades the front-end TIA bandwidth, which is defined by its input node capacitance. Thus, there is a maximum coupling capacitor ($C_C$) that can be used without degrading the TIA bandwidth. On the other hand, the biasing voltage across the photo diode 11 is defined by the following equation:

$$V_{BIAS} = V_{PD} - V_B - I_{DC} \times R_C, \quad (3)$$

where $V_{BIAS}$ is the reverse biasing voltage across the photo diode PN junction. High photo diode reverse biasing voltage is required to obtain good photo diode responsivity and low PN junction capacitance. However, equation (3) shows that $V_{BIAS}$ depends on PD average current and leads to different PD biasing for different received optical power. Furthermore, a large $R_C$ value impedes receiving high optical power levels as the DC current will be large and the voltage drop across $R_C$ will be huge. As a numerical example, an $I_{DC}$ of 10 μA leads to a 10V drop on a 1 MΩ resistor $R_C$, which is not practical. Moreover, the situation in coherent optical receivers is much worse as the photo diode DC current is around 1 mA and requires an $R_C$ of less than 1 kΩ for less than 1 V drop across the biasing resistor $R_C$.

An object of the present invention is to overcome the shortcomings of the prior art by providing a DC current cancellation loop for use with a fully differential front-end TIA structure.

SUMMARY OF THE INVENTION

Accordingly, the present invention relates to an optical receiver comprising:

a first photodetector (PD) for converting a first input optical signal into a first PD current comprising a first AC component and a first DC component;

a transimpedance amplifier (TIA) for converting the first AC component into a first voltage signal; and a first DC cancellation loop including an input and an output between the first PD and the TIA for cancelling the first DC component, the first DC cancellation loop comprising:

a first input and a first output connected to an input of the TIA;

a first trans-conductance cell ($G_M$), capable of drawing in the first DC component, such that the first DC cancellation loop maintains a first DC voltage value of the first input of the TIA the same as a first reference voltage ($V_{REF}1$), which represents an actual TIA input voltage for a zero DC current condition; and a first low pass filter.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 3:
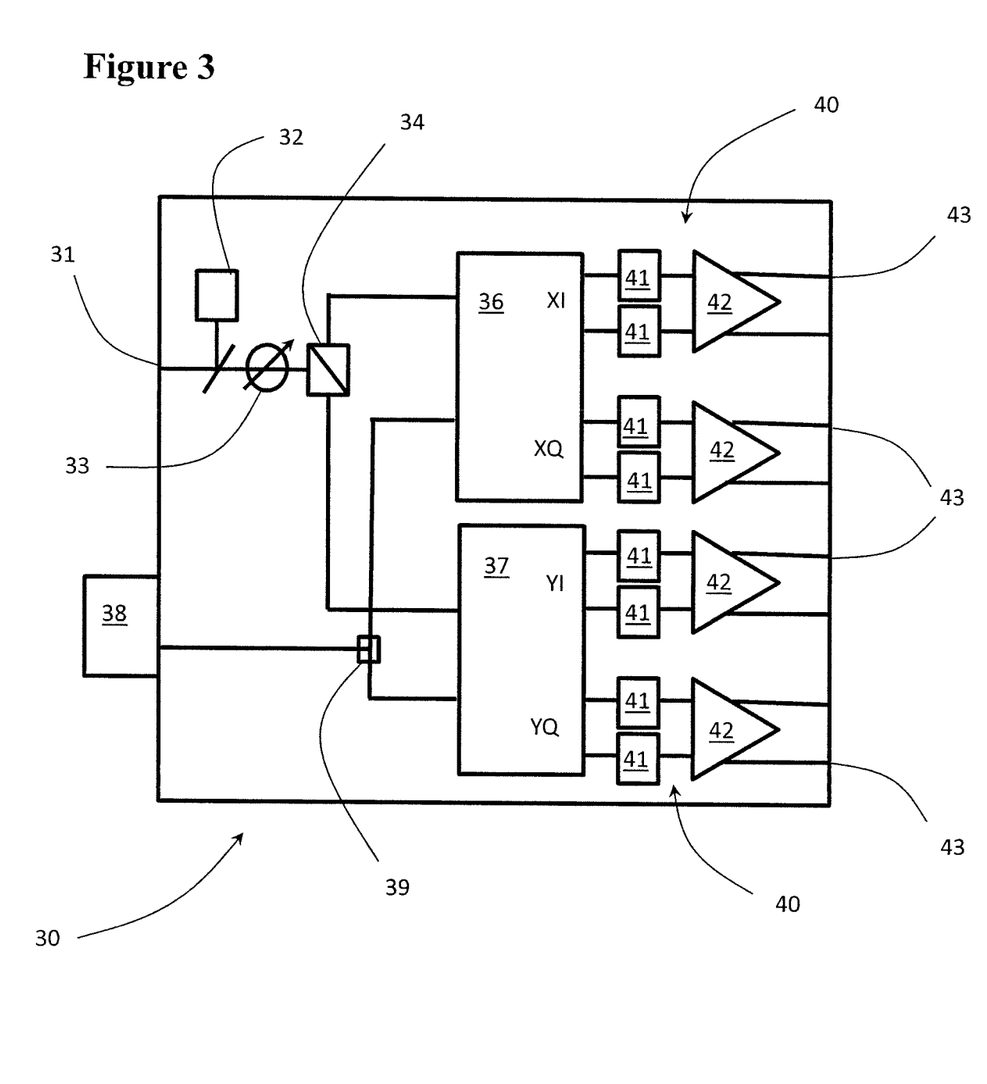
FIG. 3 illustrates a schematic diagram of a fully differential optical receiver in accordance with an embodiment of the present invention.

FIG. 3 illustrates an embodiment of an electronic component in a packaged optical receiver 30 in accordance with an embodiment of the present invention. An input signal enters at a port 31. A small portion of the input optical signal, e.g. less than 5%, may be split off and sent to a monitor photodiode 32, which generates an electrical signal that may be used to monitor properties of the input optical signal, such as its power content. In other embodiments, the power of the input optical signal can be monitored using different hardware. The remainder of the input optical signal may be sent through a variable optical attenuator 33, which can adjust the signal intensity. A polarization beam splitter (PBS) 34 splits the remainder of the input optical signal into x-polarized (X-Pol) and y-polarized (Y-Pol) components. The X-Pol component is sent to a 90° hybrid mixer 36, and the Y-Pol component is sent to a 90° hybrid mixer 37. Simultaneously, a local oscillator 38 provides a signal that is split by a beam splitter 39, and components of which are sent to each of 90° hybrid mixers 36 and 37. The 90° hybrid mixers 36 and 37 are optical components that each generate two phase differentiated optical signals, the XI and XQ signals and the YI and YQ signals, respectively. Finally, each of the four phase differentiated signals are converted to electrical signals by respective optical receivers 40, including photodetectors 41 and transimpedance amplifiers (TIA) 42. The electrical signals are then provided at four respective output terminals, which may be single-sided signals referenced to a common ground or may be differential signals.

Figure 4:
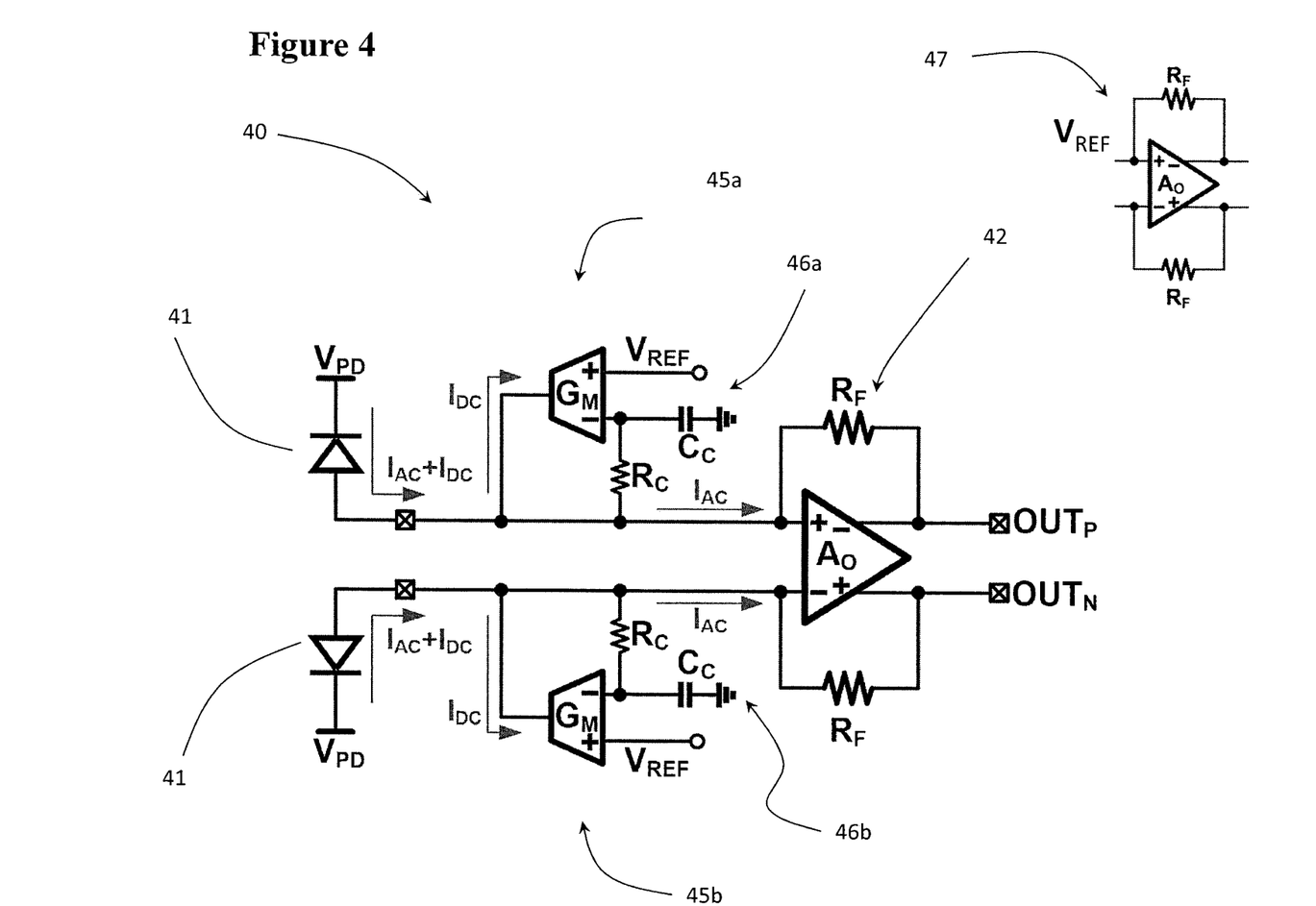
FIG. 4 illustrates a photodetector and differential TIA structure of the optical receiver of FIG. 3.

FIG. 4 illustrates an embodiment of the optical receiver 40 including an active AC coupling circuitry disposed between the photo diode (PD) 41 and the front-end differential TIA 42. An analog DC cancellation loop 45a and 45b is located prior to each input of the TIA 42, and draws the photo diode DC current $I_{DC}$, whereby only the AC signal $I_{AC}$ is coupled to the TIA 42. Two different analog cancellation loops 45a and 45b are used at both TIA inputs. Each cancellation loop 45a and 45b comprises a low pass filter section 46a and 46b, e.g. comprised of a cancellation resistor $R_C$ and a cancellation capacitor $C_C$, and a trans-conductance cell (GM), such that the input and output of each cancellation loop 45a and 45b are connected to the input of the TIA input 42, i.e. both the input and output of the loops 45a and 45b are between the PD 41 and the TIA 42, as shown in FIG. 4. Photo diode DC current $I_{DC}$ is drawn from the input node of the TIA 42 in the $G_M$ cell, such that the analog loops 45a and 45b maintain the DC voltage value of the TIA input node to be the same as a reference voltage ($V_{REF}$). This reference voltage $V_{REF}$ represent the actual TIA input node voltage for a zero DC current condition, which means that on average there is no current flowing into each of the differential TIA inputs. The term "zero" DC current means very little current, e.g. less than 100 uA or, ideally, less than a value that would significantly impact other TIA performance characteristics, such as linearity and bandwidth. Accordingly, the DC cancellation loops 45a and 45b greatly preserve the linearity of the TIA 42 and the optical receiver 40, because if the DC current is not canceled, it would flow into the TIA 42 and change the bias point, output signal common mode, and may even completely saturate the TIA 42, rendering it useless.

A method of generating $V_{REF}$ includes using a replica TIA 47, also shown in FIG. 4. The replica TIA 47 includes floating inputs and outputs and substantially the same structure as the main TIA 42, in order to generate a correct $V_{REF}$ voltage, corresponding to a zero DC input current condition. Using a replica TIA 47 provides a simple way to track the main TIA 42 across process, voltage and temperature (PVT) variations, and to automatically generate a correct $V_{REF}$ in all cases. The trade-off of using the replica TIA 47 is additional power dissipation. In order to minimize the additional power dissipation from the replica TIA 47, it may be scaled down. For example, the replica TIA 47 may use a fraction, e.g. ¼, of the bias current of the main TIA 42, flowing through resistors RF that are 4× larger than the resistors in the main TIA 42. Accordingly, the same $V_{REF}$ voltage is generated, while burning only ¼ of the power of the main TIA 42. Scaling will reduce the quality of the PVT tracking of the replica TIA 47, so the scaling factor has to be selected carefully, to achieve the perfect balance between PVT tracking and power dissipation. It should be noted that $V_{REF}$ may be generated in a variety of other ways, without using a replica TIA. For example, a custom analog circuit may be constructed to simultaneously achieve the goals of correct $V_{REF}$ generation, with PVT tracking, and minimum power dissipation.

There are two important specifications that are advantageous from the DC cancellation loops 45a and 45b that define their loop gain-bandwidth product (GBW). First, the cancellation loops 45a or 45b should not affect or attenuate the received high speed signal. Second, the loops 45a or 45b should track any variation in the photo diode DC current $I_{DC}$ and completely cancel it. This implies that the speed of the analog cancellation loops 45a and 45b are bonded by two main upper and lower limits, which are the lowest frequency component of the received data (upper limit) and the fastest variation of the photo diode DC current $I_{DC}$ (lower limit). The gain-bandwidth product of this analog loop 45a or 45b is calculated as, $$GBW = \frac{G_M \times R_F}{A_O} \times \frac{1}{2\pi R_C C_C}; \quad (5)$$

where $R_F$ is the TIA feedback resistor and $A_O$ is the TIA feed-forward amplifier DC gain. The closed loop response of the loops 45a or 45b introduces a cutoff frequency in the TIA transfer function which equals the open loop GBW product (FC=GBW). The proposed architecture has several advantages over prior art topologies which are:

1) more convenient in realizing the low pass filter section 46a and 46b ($R_C$, $C_C$) than prior art, and 2) suitable for fully differential TIA topologies unlike prior art.

The actual realization of the R-C section of the low pass filters 46a and 46b is more convenient in the proposed architecture than implementing passive AC coupling circuitry at the TIA input as in prior art because of two reasons: 1) there is no upper limit on the maximum value of the resistor $R_C$ as no DC current flows in it, and 2) $C_C$ parasitic capacitance doesn't harm the TIA bandwidth as it is placed away from the RF signal path between the GM cell input to the ground.

Furthermore, the proposed architecture is more suitable for fully differential front-end TIA architecture than the prior art. In fully differential TIAs 42, each output depends on both inputs due to the high common mode rejection of the fully differential TIA 42. Assuming an ideal differential amplifier $A_O$ employed in the TIA 42 (common mode gain=0, differential mode gain=∞), TIA output voltages ($V_{OUTP}$, $V_{OUTN}$) are expressed as, $$V_{OUTP} = -\frac{R_F}{2}(I_P - I_N),\qquad\text{6a}$$

$$V_{OUTN} = \frac{R_F}{2}(I_P - I_N),\qquad\text{6b}$$

where $I_P$ and $I_N$ are the input positive and negative currents of the differential TIA 42, respectively. Equation (6) implies that both $V_{OUTP}$ and $V_{OUTN}$ depend on $I_P$ and $I_N$ with the same weight and opposite effect. Thus, the prior art cannot be employed with a fully differential TIA because the two cancellation loops 45a and 45b will be strongly coupled and affected by each other. However, in the pseudo differential topology of the present invention, each output $V_{OUTP}$ and $V_{OUTN}$ (positive or negative) depends only on the corresponding input current $I_{AC}$ which makes the two cancellation loops 45a and 45b decoupled and the cancellation performed correctly. Accordingly, the proposed AC coupling scheme offers better isolation between the DC cancellation loops 45a and 45b, in particular with the fully differential TIA 42, because the sensing operation is performed at the input of the TIA 42.

Figure 5:
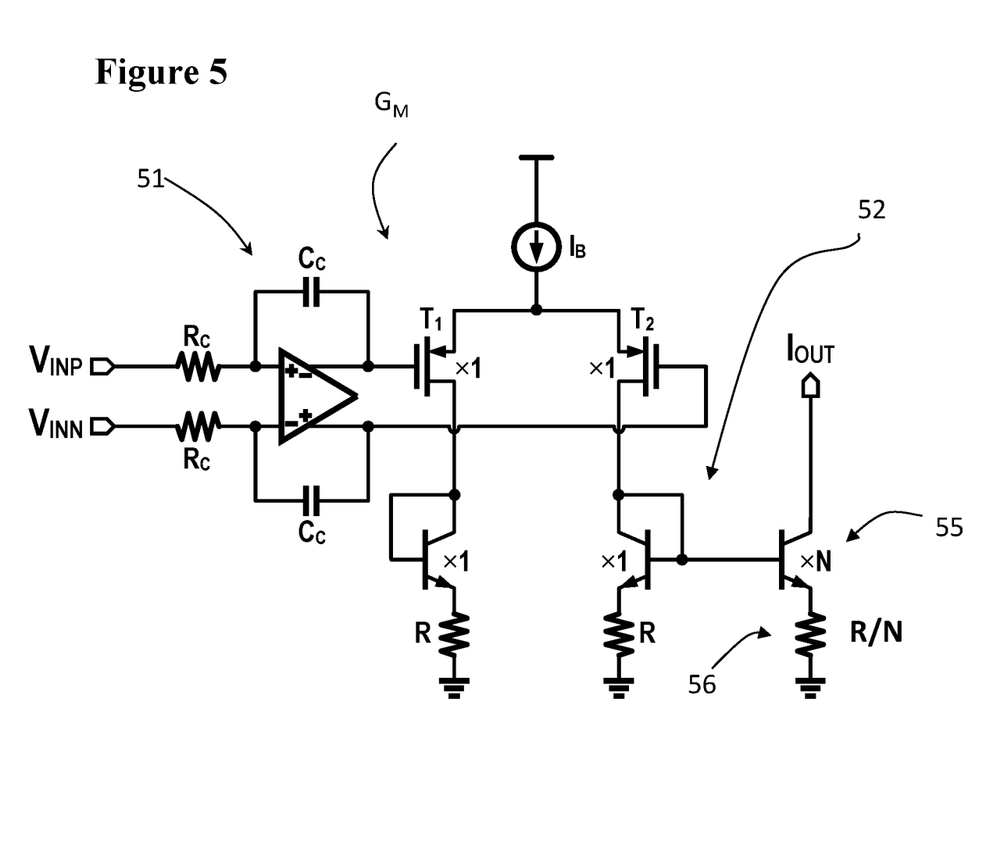
FIG. 5 illustrates an embodiment of a transconductance cell in accordance with the present invention.

One way to implement the trans-conductance ($G_M$) cell with the loop pass filter 45a and 45b R-C section for a single-ended TIA is illustrated in FIG. 5 for the proposed active AC coupling circuitry 40. The trans-conductance cell $G_M$ draws a current ($I_{OUT}$) proportional to the DC component of the differential input ($V_{INP}$-$V_{INN}$). The GM cell comprises a voltage amplifier 51 followed by a differential pair ($T_1$, $T_2$) of transistors. A current steering is performed linearly in the differential pair $T_1$ and $T_2$ using the differential input DC voltage ($V_{INP}$-$V_{INN}$) such that the output current equals $I_B/2*N$ at $V_{INP}=V_{INN}$ and its maximum value is $I_B*N$. The AC trans-conductance of the proposed GM cell is expressed as, $$G_M = A \times g_m \times N,$$

where A is the gain of the amplifier 51 and $g_m$ is the trans-conductance of the differential pair ($T_1$, $T_2$) each transistor having a resistor R connected thereto. N is a scaling factor for the output emitter-degenerated current mirror 52, where the output bipolar transistor 55 is made N longer and the degeneration resistor 56 is N times smaller. N may or may not be an integer. The scaling factor N enables the trans-conductance cell to operate with a smaller bias current from bias current source $I_B$, and thereby to reduce power dissipation. The bias current source $I_B$ is connected to both of the transistors $T_1$ and $T_2$ of the differential pair. The output $I_{OUT}$ is connected to the second transistor $T_2$ via an output transistor 55 and the output resistor 56 R/N.

Accordingly, to determine the value for N, the first step is to determine the value for $I_{OUT}$ or $V_{REF}$, based on system requirements, i.e. how much DC current $I_{DC}$ needs to be cancelled. For example, if $I_{OUT}$ is 4 mA, it is undesirable to burn another 4 mA in the bias current $I_B$. Accordingly, a scaling factor of, e.g. pick N=40, is selected, whereby $I_B=I_{OUT}/N=100$ uA, which adds only a small number to the overall power dissipation. In practice, N should not be too large, but typically does not have to be, because at some point, it does not make sense to push N to much higher values, as the goal of reducing power dissipation has typically already been achieved. Accordingly, N may be in the range from N=1 to N=1000, preferably N=4 to N=40, but it can be any another number, equal or greater than 1, N>1. Formally, there is no reason why N cannot be less than 1, but may be wasteful.

The capacitor $C_C$ of the $R_C$ loop pass filter section 46a and 46b may be implemented using a miller capacitor between the input and output of the voltage amplifier 51 to boost its value by the voltage amplifier gain, which helps in reducing the size of the implemented R-C section 46a and 46b. The loop pass filter cutoff frequency is expressed as, $$f_c = \frac{1}{A} \times \frac{1}{2\pi R_c C_c}.$$

There are several reasons why a fully differential TIA front end is better than the most commonly used single-ended. First, the fully differential TIA front end has an excellent CMRR (common mode rejection ratio). Coherent receivers often have challenging CMRR requirements, and a fully differential TIA easily meets and exceeds most CMRR specs. Second, fully differential TIA front ends have better power supply and ground noise rejection. Third, the output of a fully differential TIA is fully compatible with the differential amplifier stages, so there is no need to convert the signal from single-ended to differential.

However, the present invention may be used in non-coherent systems, since large DC currents can result from poor extinction ratio of the optical signal or if APDs are used there could be a very significant dark current.

Figure 6:
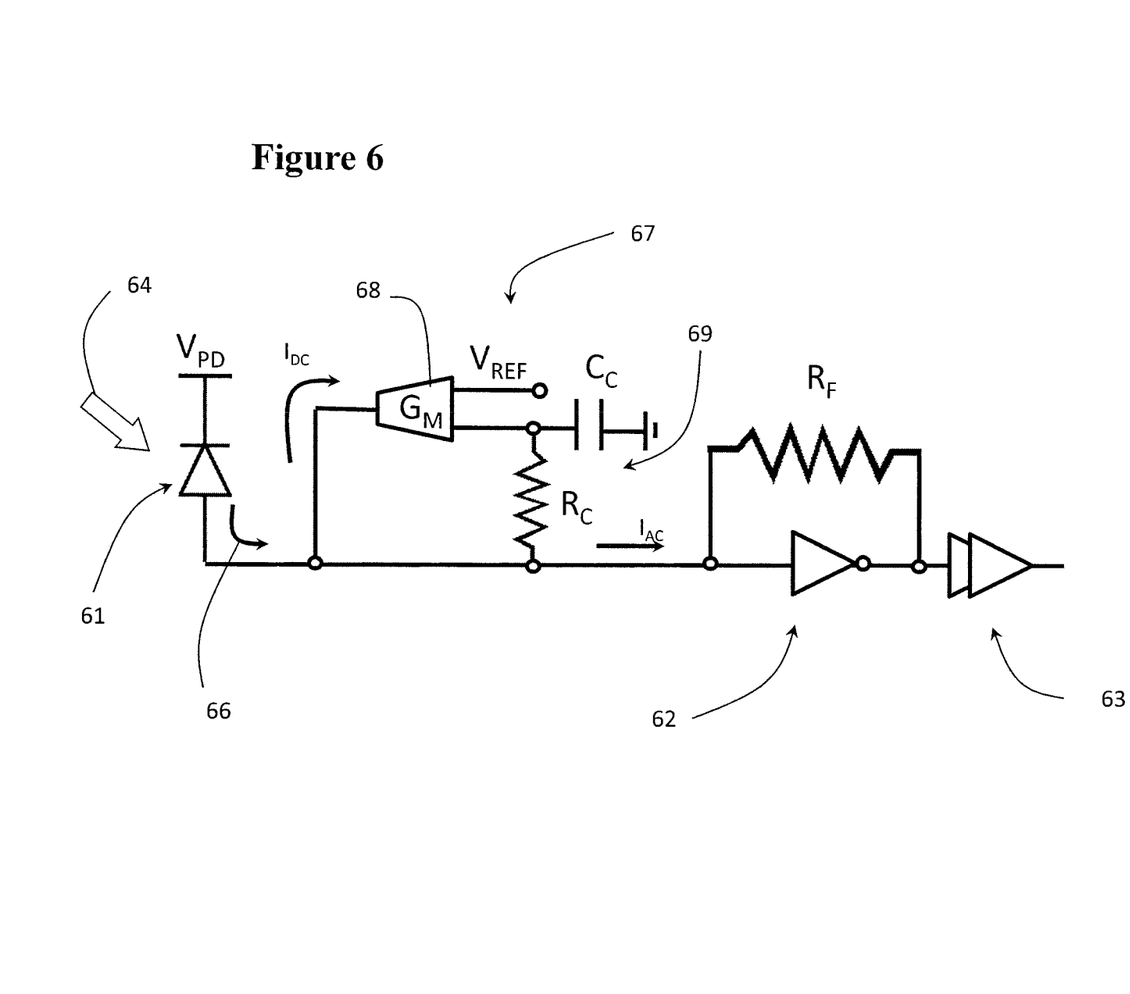
FIG. 6 illustrates another embodiment of a photodetector and TIA structure of an optical receiver of the present invention.

With reference to FIG. 6, an optical receiver front-end is composed of a photo diode (PD) 61 followed by a trans-impedance amplifier (TIA) 62 and main amplifiers (MAs) 63. The PD 61 receives a transmitted optical signal 64 and generates a current 66 proportional to the received optical power of the received optical signal 64. The ratio between PD output current 6 to the input optical power of the optical signal 64 is the photo diode responsivity (R). The TIA 62 converts the PD current 66 to voltage, which is and then amplified by MAs 63 to the desired signal level.

An active AC coupling circuitry is disposed between the photo diode (PD) 61 and the TIA 62. An analog DC cancellation loop 67 is located prior to each input of the TIA 62, and draws the photo diode DC current $I_{DC}$, whereby only the AC signal $I_{AC}$ is coupled to the TIA 62. The cancellation loop 67 comprises a trans-conductance (GM) cell 68, and a low pass filter section 69, e.g. comprised of a cancellation resistor $R_C$ and a cancellation capacitor $C_C$. The input and output of the cancellation loop 67 is connected to the input of the TIA 62, i.e. both the input and output of the loop 67 are between the PD 61 and the TIA 62, as shown in FIG. 6. Photo diode DC current $I_{DC}$ is drawn from the input node of the TIA 62 in the GM cell 68, such that the analog loop 67 maintains the DC voltage value of the TIA input node to be the same as a reference voltage ($V_{REF}$). This reference voltage $V_{REF}$ is an input node voltage of a replica TIA, which represent the actual TIA input node voltage for a zero DC current condition.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical receiver comprising:
   a first photodetector (PD) for converting a first input optical signal into a first PD current comprising a first AC component and a first DC component;
   a first transimpedance amplifier (TIA) for converting the first AC component into a first voltage signal, the first TIA comprising a first TIA input;
   a signal path electrically connecting the first TIA to the first PD; and
   a first DC cancellation loop connected to the signal path between the first PD and the first TIA for cancelling the first DC component, the first DC cancellation loop comprising:
     a first input and a first output each connected to the first TIA input;
     a first trans-conductance cell capable of drawing in the first DC component, such that the first DC cancellation loop maintains a DC voltage at the first TIA input substantially the same as a reference voltage, wherein the reference voltage is equal to an input voltage to the first TIA for a zero DC current condition;
     a first low pass filter; and
     a replica TIA configured to provide the reference voltage to the first trans-conductance cell, wherein the replica TIA is a replica of the first TIA.

2. The optical receiver according to claim 1, wherein the first low pass filter comprises a first resistor and a first capacitor; and wherein the first capacitor is placed away from the signal path between the first TIA and the first PD.

3. The optical receiver according to claim 1, wherein the first DC cancellation loop is configured to have an upper speed limit, which is equal or smaller than a lowest frequency component of the first input optical signal, and a lower speed limit, which is equal or greater than a fastest variation of the first DC component.

4. The optical receiver according to claim 1, wherein the replica TIA comprises a floating input.

5. An optical receiver comprising:
   a first photodetector (PD) for converting a first input optical signal into a first PD current comprising a first AC component and a first DC component;
   a first transimpedance amplifier (TIA) for converting the first AC component into a first voltage signal, the first TIA comprising a first input;
   a signal path electrically connecting the first TIA to the first PD; and
   a first DC cancellation loop connected to the signal path between the first PD and the first TIA for cancelling the first DC component, the first DC cancellation loop comprising:
     a first input and a first output each connected to the first input of the first TIA;
     a first trans-conductance cell capable of drawing in the first DC component, such that the first DC cancellation loop maintains a first DC voltage value of the first input of the first TIA substantially the same as a first reference voltage, wherein the first reference voltage is equal to an input voltage to the first TIA for a zero DC current condition; and
     a first low pass filter;
   wherein the first trans-conductance cell comprises a voltage amplifier, a bias current source, a differential pair ($T_1$, $T_2$) of transistors, and a current mirror;
   wherein an AC trans-conductance GM of the first trans-conductance cell is generally proportional to a product of a gain A of the voltage amplifier, a trans-conductance $g_m$ of the differential pair ($T_1$, $T_2$), and a scaling factor N of the current mirror, wherein N≥1.

6. The optical receiver according to claim 5, wherein the first low pass filter comprises a miller capacitor disposed between an input and an output of the voltage amplifier.

7. The optical receiver according to claim 5, wherein N is between 4 and 40.

8. An optical receiver comprising:
   first and second photodetectors (PD) each for converting an input optical signal into a PD current comprising an AC component and a DC component;
   a first differential transimpedance amplifier (TIA) comprising a first TIA input electrically connected to the first PD and a second TIA input electrically connected to the second PD;
   first and second DC cancellation loops connected to the first and second TIA inputs, respectively, for cancelling the DC components, each of the first and second DC cancellation loops comprising:
     an input and an output connected to one of the TIA inputs;
     a trans-conductance cell capable of drawing one of the DC components to maintain a DC voltage at one of the TIA inputs substantially the same as a reference voltage; and
     a low pass filter; and
   at least one replica TIA configured to provide, to the trans-conductance cells, the reference voltages being equal to input voltages to the first and second TIA inputs for a zero input DC current condition.

9. The optical receiver according to claim 8, further comprising:
   an input port for inputting a combined optical signal;
   a polarization beam splitter for splitting the combined optical signal into first and second polarized components;
   a local oscillator for generating first and second oscillator components;
   a first hybrid mixer for generating first and second phase differentiated optical signals from the first polarized component and the first oscillator component;
   a second hybrid mixer for generating third and fourth phase differentiated optical signals from the second polarized component and the second oscillator component;
   wherein the input optical signals comprise the first and second phase differentiated optical signals.

* * * * *